(12) United States Patent
Xing et al.

(10) Patent No.: US 11,289,677 B2
(45) Date of Patent: Mar. 29, 2022

(54) DISPLAY PANEL AND DISPLAY DEVICE HAVING A PROTECTIVE PATTERN

(71) Applicant: Yungu (Gu' an) Technology Co., Ltd., Langfang (CN)

(72) Inventors: Zhenhua Xing, Kunshan (CN); Jinqiang Liu, Kunshan (CN); Jiamei Du, Kunshan (CN); Yaoyan Wu, Kunshan (CN); Yawei Liu, Kunshan (CN); Dongkun Liu, Kunshan (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 501 days.

(21) Appl. No.: 16/342,199

(22) PCT Filed: Jan. 11, 2019

(86) PCT No.: PCT/CN2019/071469
§ 371 (c)(1),
(2) Date: Apr. 15, 2019

(87) PCT Pub. No.: WO2019/205747
PCT Pub. Date: Oct. 31, 2019

(65) Prior Publication Data
US 2021/0367200 A1    Nov. 25, 2021

(30) Foreign Application Priority Data

Apr. 25, 2018  (CN) .......................... 201810378655.0
May 2, 2018    (CN) .......................... 201820641602.9

(51) Int. Cl.
H01L 51/52    (2006.01)
H01L 33/60    (2010.01)
(Continued)

(52) U.S. Cl.
CPC ........ H01L 51/5253 (2013.01); H01L 51/529 (2013.01); H01L 51/56 (2013.01);
(Continued)

(58) Field of Classification Search
CPC .............. H01L 51/5253; H01L 51/529; H01L 51/5218; H01L 51/5246; H01L 51/5234;
(Continued)

(56) References Cited

U.S. PATENT DOCUMENTS 10,008,696 B2  6/2018  Gai et al.
10,181,586 B2  1/2019  Schicktanz et al.
(Continued)

FOREIGN PATENT DOCUMENTS

CN    104037337 A    9/2014
CN    104846331 A    8/2015
(Continued)

OTHER PUBLICATIONS

CN First Office Action dated Mar. 20, 2019 in the corresponding CN application (application No. 201810378655.0).

*Primary Examiner* — Ida M Soward
(74) *Attorney, Agent, or Firm* — Kilpatrick Townsend & Stockton

(57) ABSTRACT

The present disclosure relates to display panels and display devices. A display panel has a display area and a package area surrounding the display area. The display panel includes a substrate and a package cover plate bonded to the substrate in the package area via a package material melted by laser irradiation. The display area is provided with at least one mounting hole having a hole wall, and at least a portion of the hole wall of the mounting hole is coated with the package material. A protective pattern layer disposed between at least a portion of a boundary of the package area and the mounting hole is further included for blocking at (Continued)

least a portion of a laser beam during a movement of the laser beam from the package area to the mounting hole.

20 Claims, 3 Drawing Sheets

(51) Int. Cl.
    *G02F 1/133*     (2006.01)
    *F21K 9/66*     (2016.01)
    *H01L 51/56*     (2006.01)
    *G02F 1/1333*     (2006.01)

(52) U.S. Cl.
    CPC .......... *F21K 9/66* (2016.08); *G02F 1/133331* (2021.01); *H01L 33/60* (2013.01); *H01L 51/5218* (2013.01); *H01L 51/5234* (2013.01); *H01L 51/5246* (2013.01); *H01L 2251/301* (2013.01); *H01L 2251/308* (2013.01)

(58) Field of Classification Search
    CPC ......... H01L 2251/301; H01L 2251/308; H01L 33/60; G02F 1/133331; F21K 9/66
    See application file for complete search history.

(56) References Cited

U.S. PATENT DOCUMENTS

| | | | |
|---|---|---|---|
| 2005/0162077 A1* | 7/2005 | Park | H01L 51/5259 313/504 |
| 2008/0237840 A1* | 10/2008 | Alcoe | H01L 23/10 257/706 |
| 2008/0290438 A1* | 11/2008 | Weng | H01L 27/14618 257/434 |
| 2014/0311668 A1* | 10/2014 | Yanagi | H01L 51/5259 156/273.7 |
| 2016/0336539 A1* | 11/2016 | Liu | H01L 51/56 |
| 2016/0372529 A1* | 12/2016 | Wu | H01L 51/56 |
| 2016/0372700 A1* | 12/2016 | Baisl | H01L 51/56 |
| 2016/0380228 A1* | 12/2016 | Yang | H01L 51/5246 257/40 |
| 2017/0062759 A1* | 3/2017 | Gai | H01L 51/525 |
| 2017/0183767 A1 | 6/2017 | Hong | |
| 2017/0194595 A1 | 7/2017 | Li et al. | |
| 2017/0205771 A1* | 7/2017 | Lin | G04C 17/0091 |
| 2017/0294623 A1* | 10/2017 | Gai | H01L 27/3244 |
| 2018/0110136 A1 | 4/2018 | Zhang et al. | |
| 2018/0233705 A1* | 8/2018 | Xu | H01L 51/5246 |
| 2018/0331320 A1* | 11/2018 | Su | H01L 27/3246 |
| 2019/0169470 A1* | 6/2019 | Dollase | C09J 7/22 |

FOREIGN PATENT DOCUMENTS

| | | |
|---|---|---|
| CN | 105098092 A | 11/2015 |
| CN | 105470409 A | 4/2016 |
| CN | 205582942 U | 9/2016 |
| CN | 106206988 A | 12/2016 |
| CN | 106298836 A | 1/2017 |
| CN | 206210847 U | 5/2017 |
| CN | 107112436 A | 8/2017 |
| CN | 105098092 B | 11/2017 |
| CN | 107342371 A | 11/2017 |
| CN | 107359185 A | 11/2017 |
| CN | 107369783 A | 11/2017 |
| CN | 107799665 A | 3/2018 |
| CN | 107819081 A | 3/2018 |
| JP | 2016046215 A | 4/2016 |
| WO | 2019019656 A1 | 1/2019 |

* cited by examiner

DISPLAY PANEL AND DISPLAY DEVICE HAVING A PROTECTIVE PATTERN

CROSS-REFERENCE TO RELATED APPLICATIONS

This application is a U.S. national Stage of International Application No. PCT/CN2019/071469, filed on Jan. 11, 2019, designating the United States, which claims priority to Chinese Patent Application No. 201810378655.0, filed with the Chinese Patent Office on Apr. 25, 2018 and to Chinese Patent Application No. 201820641602.9, filed with the Chinese Patent Office on May 2, 2018, and entitled "DISPLAY PANEL AND DISPLAY DEVICE", the content of each of which is hereby incorporated by reference in its entirety.

TECHNICAL FIELD

The present disclosure relates to the field of display technologies, and more particularly relates to a display panel and a display device.

BACKGROUND

In recent years, with the development of technologies of intelligent terminal devices and wearable devices, the demand for flat panel displays has been increasingly diversified. For example, an Organic Light-Emitting Diode (OLED) display has a self-luminous property, which eliminates an energy-consuming backlight module when compared with a liquid crystal display, therefore, it has a characteristic of saving more energy. In addition, the OLED display, compared with a conventional flat panel display, has advantages such as bendability, great flexibility, etc., thereby being widely used in smart terminal products such as mobile phones and tablet computers.

The present disclosure relates to the field of display technologies, and more particularly relates to a display panel and a display device.

As an appearance of the OLED display is easy to customize, it is applied to a full screen product and frameless product by more and more terminal manufacturers. However, the full screen product and the frameless product both require a larger light-emitting area, and in practical application, it is usually required to provide a mounting hole in the OLED display to reserve a mounting position for electronic components such as a front camera, an earpiece or the like, on a terminal device.

When packaging an OLED display device, a cover glass covering an organic light emitting component is usually bonded to a substrate as a base via a package material. Specifically, the package material is provided in a package area of the cover glass. After the cover glass is covered on the organic light emitting component, the package material in the package area is irradiated with a high-energy laser and is heated and melted and flows onto the substrate, thereby bonding the cover glass and the substrate, and the package being completed. As for the package of a display panel provided with the mounting hole, the laser is not temporarily turned off when passing through an area covered by the organic light emitting component, in consideration of a lifetime of a laser apparatus and a package process requirement, and the high-energy laser may sweep the organic light emitting component, damaging the organic light emitting component.

SUMMARY

Accordingly, the present disclosure provides a display panel and a display device, which can avoid damage to the display panel during the package process of the display panel.

According to an embodiment, a display panel is provided in the present disclosure, which has a display area and a package area surrounding the display area. The display panel includes: a substrate; and a package cover plate, bonded to the substrate in the package area via a package material melted by laser irradiation. The display area is provided with at least one mounting hole having a hole wall. At least a portion of the hole wall of the mounting hole is coated with the package material melted by laser irradiation. A protective pattern layer disposed between at least a portion of a boundary of the package area and the mounting hole is further included for blocking at least a portion of a laser beam during a movement of the laser beam from the package area to the mounting hole.

In the aforementioned display panel, during the movement of the laser beam from the package area to the mounting hole, the protective pattern layer can block at least a portion of energy of the laser beam, so that an organic light emitting component and other components (e.g., a thin film transistor) in the display area will not be irradiated by a high intensity laser, thereby prevents the components in the display area from generating static electricity or being damaged. Thus, there is no need to pause the laser during a package process of the display panel, which simplifies the package process and fully utilizes the laser energy to ensure precision of the package process at the same time.

In an embodiment, the protective pattern layer includes at least one reflective layer, which reflects at least a portion of the laser beam.

In an embodiment, a material of the reflective layer includes one or more material of molybdenum, aluminum, and silver.

In an embodiment, the protective pattern layer includes at least one absorbing layer, and the absorbing layer absorbs at least a portion of the laser beam.

In an embodiment, a material of the absorbing layer includes indium tin oxide.

In one embodiment, when the laser beam is incident from a side where the package cover plate is located, and the protective pattern layer is disposed on a surface of the package cover plate away from the substrate.

In an embodiment, when the laser beam is incident from a side where the substrate is located, and the protective pattern layer is disposed on a surface of the substrate away from the package cover plate.

In one embodiment, a boundary of an orthographic projection of the protective pattern layer on the substrate surrounds a region of an orthographic projection of a path of the movement of the laser beam on the substrate from the boundary of the package area to the mounting hole.

In one embodiment, the display panel further includes: a package structure disposed on the substrate; and a heat dissipation structure close to the mounting hole and disposed inside the package structure.

In an embodiment, the heat dissipation structure is disposed around the mounting hole.

In an embodiment, the heat dissipation structure is in contact with a surface of the substrate close to the package structure.

In an embodiment, the heat dissipation structure includes a thermal conductive layer disposed around the mounting hole.

In an embodiment, the heat dissipation structure further includes a heat insulation layer disposed around an outer side wall of the thermal conductive layer.

In one embodiment, a height of the heat insulation layer with respect to a surface of the substrate close to the package structure is greater than or equal to a height of the thermal conductive layer with respect to a surface of the substrate close to the package structure.

In one embodiment, the package structure includes at least two inorganic package layers arranged in a stack; and at least one organic package layer disposed between the inorganic package layers.

In an embodiment, the heat dissipation structure is disposed between the organic package layer and the mounting hole.

In an embodiment, a material of the inorganic package layer includes one or more of silicon oxide, silicon nitride, aluminum oxide, titanium oxide, and graphene.

In an embodiment, a material of the organic package layer includes one or more of acrylic resin, polyterephthalic acid plastic, pressure sensitive adhesive, polyethylene naphthalate, and parylene.

A display panel is further provided in the present disclosure, which is a display panel with the protective pattern layer removed after a package of the display panel of the afore-described embodiments is completed.

A display device is further provided in the present disclosure, which includes the display panel of the above-described embodiments.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings according to the accompanying drawings without creative efforts.

DETAILED DESCRIPTION OF THE EMBODIMENTS

Figure 1:
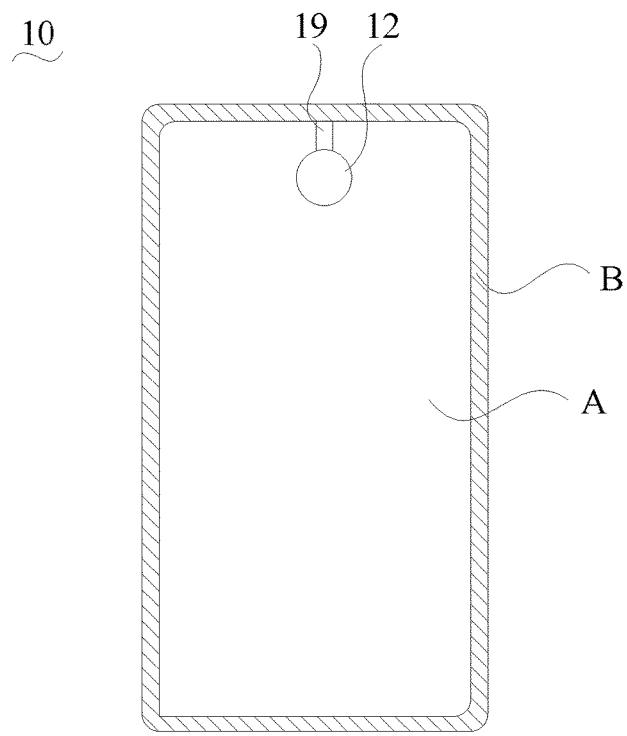
FIG. 1 is a schematic diagram of a display panel in accordance with an embodiment.

In order to facilitate the understanding of the present disclosure, the present disclosure will be described more fully hereinafter with reference to the accompanying drawings. Preferred embodiments of the present disclosure are shown in the drawings. However, the disclosure can be embodied in many different forms and is not limited to the embodiments described herein. These embodiments are provided for the purpose of providing a more complete and comprehensive understanding of the disclosure of the present application. Unless otherwise formed, all terms (including technical and scientific terms) used herein have the same meaning as commonly understood by one of ordinary skill in the art to which this disclosure belongs. The terms used in the specification of the present disclosure is merely for the purpose of describing particular embodiments, not intended to limit the present disclosure.

In production and manufacture of a display panel, in order to reduce a manufacturing cost and facilitate massive batch production, a plurality of display panels are generally fabricated on a relatively large display panel motherboard, and after being packaged, the relatively large display panel motherboard is subjected to a cutting process to be cut into a plurality of single bodies of display panels. For a non-flexible display panel, a package cover plate for covering an organic light emitting component is usually bonded to a substrate as a base via a package material (frit).

For example, an organic light emitting layer, a functional layer, and a metal cathode are formed on an array substrate. Then a frit pattern is printed on a package area of the array substrate. After that, the package cover plate is bonded to the array substrate. And then the frit pattern is irradiated by a laser and melted to package the package cover plate with the array substrate. Since a diameter of the laser beam used in the package process is generally on the order of millimeters and a width of the package area is on the order of a few hundred micrometers, during a process of irradiating the package material with the laser beam to melt it, a portion of the laser beam is irradiated on a display area (i.e., an area where the organic light emitting component is formed) of the array substrate. Irradiation of a high-energy laser beam causes a high amount of heat generated in the array substrate, and an instantaneous temperature can reach 800° C. to 1000° C., and static electricity is generated in the array substrate, which cause damages to the organic light emitting layer, the functional layer, the metal cathode, and the like in the display area. It should be noted that the array substrate herein can be a substrate.

A laser mask is used to block the laser beam. However, since the frit patterns of different display panels are different, the required laser masks are also different. Therefore, a versatility of the laser mask is poor. In addition, in a practical application, it is generally required to provide a mounting hole on the display panel to reserve a mounting position for electronic components such as a photosensitive module, a front camera, an earpiece, a start key, or a speaker on a terminal device. The mounting hole can be provided in a non-display area outside an effective display area. However, it limits an area of the effective display area and cannot achieve a "full screen" effect. In order to achieve the "full screen" effect, it is necessary to define the mounting hole in the display area. For the package of the display panel provided with the mounting hole, a twice package method can be adopted, that is, the laser beam is temporarily turned off after completing the package of an outer frame boundary of the display panel. For example, the laser beam is shielded with a laser shielding portion in a laser device. Then, when the laser beam emitted by the laser device is aligned to the mounting hole, the laser beam is turned on again. However, in order to simplify the package process as much as possible while considering a lifetime of the laser device, it is desirable to realize a single package in the production, that is, after completing the package of the outer frame boundary of the display panel, it is not required to temporarily turn off the laser beam, instead, the laser beam is directly moved to the mounting hole to package a hole wall of the mount hole.

Therefore, it is necessary to provide a display panel and a display device capable of preventing the laser beam from damaging the display area even if the laser beam is not temporarily turned off during the package process.

The display panel provided in the embodiments of the present disclosure is mainly applied to a full-screen or frameless display panel, and can also be applied to a conventional display panel having a frame or a narrow frame.

Figure 2:
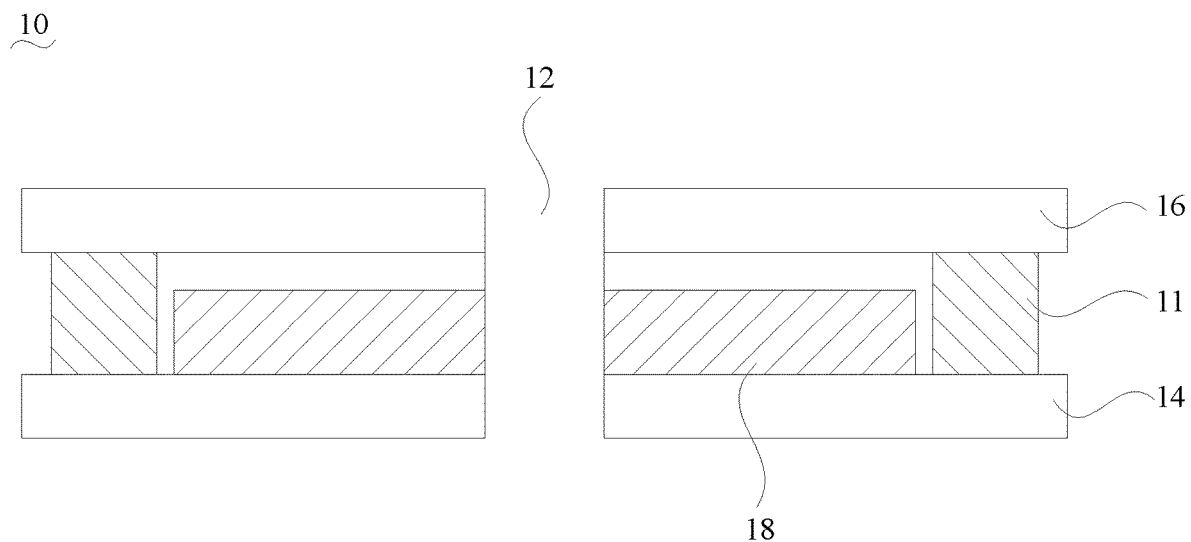
FIG. 2 is a cross-sectional view of the display panel of FIG. 1.

FIG. 1 is a schematic diagram of a display panel according to an embodiment of the present disclosure. FIG. 2 is a cross-sectional view of the display panel of FIG. 1. For ease of description, only portions related to the present disclosure are shown therein.

As shown in FIG. 1, a display panel 10 has a display area A and a package area B surrounding the display area A. Further referring to the cross-sectional structure shown in FIG. 2, the display panel 10 includes a substrate 14, a package cover plate 16, and a protective pattern layer 19. The display panel 10 further includes an organic light emitting component 18 disposed between the substrate 14 and the package cover plate 16. The organic light emitting component 18 is disposed in the display area A. The substrate 14 and the package cover plate 16 are bonded in the package area B via a package material 11 melted by laser irradiation. At least one mounting hole 12 is formed in the display area A of the display panel 10, and at least a portion of a hole wall of the mounting hole 12 is coated with the package material 11 melted by laser irradiation. The mounting hole 12 can be used to mount electronic components. The electronic components may include a front photosensitive module, a camera, an earpiece, a start key, a speaker, or the like. The photosensitive module is a sensitive device having a response or conversion function to external optical signals or optical radiation, which can be used to sense light to obtain corresponding parameters, thereby assisting an operation of the display panel.

In this embodiment, the display area A, that is, an area occupied by the organic light emitting component, is a part necessary to realize display, and the package area B is an area occupied by the package material 11 (frit). The package material 11 can be proximate to the organic light emitting component 18. In some embodiments, in order to prevent heat generated by a laser spot from burning the organic light emitting component 18, a certain safe distance can also be set between the package material 11 and the organic light emitting component 18. At this time, the package area B can include the area occupied by the package material 11 and a safe distance area.

In this embodiment, the mounting hole 12 is provided in the display area A, that is, the electronic component is mounted in the display area A, which can reduce a frame area of the display panel, increase an effective area of the display area A, and achieve a manufacture of a full screen. At least a portion of the hole wall of the mounting hole 12 is also coated with the package material 11 melted by laser irradiation. The package material 11 can be coated on all film layers adjacent to the hole wall of the mounting hole 12, or be coated on a portion of the film layers adjacent to the hole wall of the mounting hole 12. For example, in some embodiments, the organic light emitting component 18 includes at least a thin film transistor, an anode layer, a light emitting layer and a cathode layer which are disposed on the substrate 14, and the package material 11 can be coated on at least the light emitting layer and the cathode layer. In other embodiments, the organic light emitting component 18 further includes other film layers such as a planarization layer, a passivation layer, a pixel defining layer disposed between the anode layer and the light emitting layer, and the like, which is not limited herein. In one embodiment, the package material 11 is coated inside the mounting hole 12 along a circumferential direction of the mounting hole 12, which can completely cover each of the film layers of the organic light emitting component 18, thereby preventing the organic light emitting component 18 from being eroded by air or water vapor, improving an operation stability of the display panel 10, and prolonging the lifetime of the display panel 10.

In some embodiments, the mounting hole 12 penetrates respective film layers on the display panel 10 and the substrate 14 in a direction perpendicular to the substrate 14, and the package material 11 can at least cover the light emitting layer and the cathode layer which are adjacent to the hole wall of the mounting hole 12. In other embodiments, the mounting hole 12 can extend without penetrating the substrate 14, which is not limited herein.

It should be emphasized that the aforementioned mounting hole 12 is an area used for mounting the electronic component, and for convenience of explanation, it is named the mounting hole 12 in the present disclosure, but the name thereof is not limited in the present disclosure, and can be modified to other names, for example, a through hole, a groove, an opening, etc. The electronic component can include one or more of a photosensitive module, a front-facing camera, a start key, an earpiece, and a speaker. The kind of the electronic component is not limited herein. A specific mounting method of the electronic component is not limited herein. When the display panel 10 is cut to form the mounting hole 12, a shape of the mounting hole 12 can be determined according to that of the electronic component needs to be mounted, and mounting holes 12 of different shapes may be provided for different electronic components. A cross-sectional shape of the mounting hole 12 in a direction parallel to the substrate 14 can be one or more of circular, elliptical, rectangular, trapezoidal, rhombic, and square. The cross-sectional shape of the mounting hole 12 can also be other regular or irregular shapes, and is not limited herein. In the embodiment shown in FIG. 1, the cross-sectional shape of the mounting hole 12 is a circular.

In an embodiment of the present disclosure, the protective pattern layer 19 is disposed between at least a portion of a boundary of the package area B and the mounting hole 12. During a movement of the laser beam from the package area B toward the mounting hole 12, the protective pattern layer 19 can block at least a portion of the laser beam. The laser beam can be incident from a side where the package cover plate 16 is located to melt the package material 11. The laser beam can also be incident from a side where the substrate 14 is located, or the laser beam can also be simultaneously incident from both sides of the display panel 10, i.e., from the side where the package cover plate 16 is located and from the side where the substrate 14 is located, respectively. For example, in some embodiments, the laser beam can be incident on the package material 11 from the side where the package cover plate 16 (e.g., a glass cover plate) is located, and the protective pattern layer 19 can be disposed on a surface of the package cover plate 16 away from the substrate 14. In other embodiments, the laser beam can be incident on the package material 11 from the side where the substrate 14 is located, and the protective pattern layer 19 can be disposed on a surface of the substrate 14 away from the package cover plate 16. In other embodiments, the laser beams can be incident on the package material 11 from both sides of the display panel 10, respectively, and the protective pattern layers 19 can be disposed on the surface of the package cover plate 16 away from the substrate 14 and the surface of the substrate 14 away from the package cover plate 16, respectively.

Therefore, during the movement of the laser beam from the package area B to the mounting hole 12, the protective pattern layer 19 blocks at least a portion of energy of the laser beam, which prevents the organic light emitting component 18 and other components (e.g., a thin film transistor) in the display area A from being irradiated by a high intensity laser, thereby preventing the components in the display area A from generating static electricity or being damaged. Thus, the laser device is not required to be paused during the package process of the display panel 10, thereby achieving a one-time package, simplifying the package process, fully utilizing the energy of the laser, and ensuring an accuracy of the package process.

The protective pattern layer in the embodiments of the present disclosure can block at least a portion of the laser beam, that is, reflect or absorb at least a portion of the laser energy during the movement of the laser beam from the package area B toward the mounting hole 12.

In some embodiment, the protective pattern layer 19 includes at least one reflective layer, which is capable of reflecting at least a portion of the laser beam. For example, the reflective layer may allow a transmission of a portion of the laser beam, or allow no transmission of the laser beam but reflect the laser beam. Specifically, the reflective layer can be a metal thin film layer. A material of the reflective layer can include, for example, one or more of molybdenum, aluminum, silver. The laser used in the package process is generally an infrared laser having a significant thermal effect, and the reflective layer made of the material such as aluminum, silver and the like can effectively reflect the infrared laser, thereby realizing the protection of the organic light emitting component 18. Of course, the reflective layer can also be made of other material capable of reflecting the laser, which is not limited herein.

In other embodiments, that protective pattern layer 19 includes at least one absorbing layer, which is capable of absorbing at least a portion of the laser beam. A material of the absorbing layer may for example include indium tin oxide (ITO). Since the infrared laser having significant thermal effect is used in the package process, and the ITO material has a low transmittance to the infrared laser, the ITO used as the material of the absorbing layer can effectively reduce the laser energy transmitted through the package cover plate or the substrate.

It should be noted that, in a specific embodiment, the protective pattern layer 19 can also be in a form of a combination of a reflective layer and an absorbing layer. For example, when the reflecting layer is positioned above the absorbing layer, the laser beam is firstly reflected by the reflecting layer, and a portion of the laser beam that is not reflected passes through the reflecting layer and is further absorbed by the absorbing layer. Therefore, only little laser energy can reach the organic light emitting component 18, or almost no laser energy can reach the organic light emitting component 18, thereby providing more effective protection for the organic light emitting component 18.

In some embodiments of the present disclosure, a boundary of an orthographic projection of the protective pattern layer 19 on the substrate 14 encompasses a region of an orthographic projection of a moving path of the laser beam from the boundary of the package area B toward the mounting hole 12 on the substrate 14. For example, the orthographic projection of the protective pattern layer 19 on the substrate 14 may coincide with the orthographic projection of the moving path of the laser beam from the boundary of the package area B toward the mounting hole 12 on the substrate 14. A laser spot formed by irradiating the display panel 10 with the laser beam is generally circular. During the movement of the laser beam, a moving area is formed, a width of which is a diameter of the laser spot. In order to ensure the blocking of the laser beam, a region of the orthographic projection of the protective pattern layer 19 on the substrate 14 should at least be same as the region of the orthographic projection of the moving path of the laser beam from the boundary of the package area B toward the mounting hole 12 on the substrate 14. Therefore, the orthographic projection of the protective pattern layer 19 on the package cover plate 16 can coincide with the orthographic projection of the moving path of the laser beam from the boundary of the package area B toward the mounting hole 12 on the substrate 14.

Of course, in some embodiments, the region of the orthographic projection of the protective pattern layer 19 on the substrate 14 can be larger than the region of the orthographic projection of the moving path of the laser beam from the boundary of the package area B to the mounting hole 12 on the substrate 14. That is, the boundary of the region of the orthographic projection of the protective pattern layer 19 on the substrate 14 surrounds a boundary of the region of the orthographic projection of the moving path of the laser beam from the boundary of the package area B toward the mounting hole 12 on the substrate 14, and there may be a certain distance between the two boundaries.

It should be noted that the moving path of the laser beam from the boundary of the package area B toward the mounting hole 12 can be a straight line or a curve line. For example, in the embodiment shown in FIG. 1, the laser beam moves in the straight line from the boundary of the package area B toward the mounting hole 12, and the protective pattern layer 19 is disposed lengthwise along a moving direction of the laser beam. One side edge of the protective pattern layer 19 along a longitudinal direction thereof is aligned with a boundary of the package area B close to the organic light emitting component 18, and the other side edge, corresponding to the foregoing one, of the protective pattern layer 19 along the longitudinal direction thereof extends to the boundary of the mounting hole 12.

One side edge of the protective pattern layer 19 along the longitudinal direction thereof can also extend into the package area B, but should not affect the irradiation of the laser beam on the package material 11 of the package area B.

In one embodiment, a display panel is further provided in the present disclosure, which is a display panel with the protective pattern layer 19 removed after the package of the display panel 10 in the forgoing embodiments is completed.

For example, in some embodiments, the protective pattern layer 19 is disposed on the surface of the package cover plate 16 away from the substrate 14, and the protective pattern layer 19 can be removed via a manner of thinning the package cover plate 16 (e.g. via a manner of grinding the package cover plate 16). Of course, the protective pattern layer 19 can be removed via other manners, which is not limited herein.

Display components such as organic light emitting components are sensitive to external factors such as water vapor and oxygen, and when exposed to water vapor or oxygen, a stability thereof is deteriorated and a lifetime thereof is shortened, thereby adversely affecting display stability and a lifetime of the display panel. Therefore, it is necessary to adopt an effective package structure to prevent water vapor, oxygen and the like from entering the display panel, so as to improve the stability of the display panel and prolong the lifetime of the display panel. However, during the process of cutting to form the mounting hole, the heat generated by the cutting can cause thermal damage to the package structure.

Figure 3:
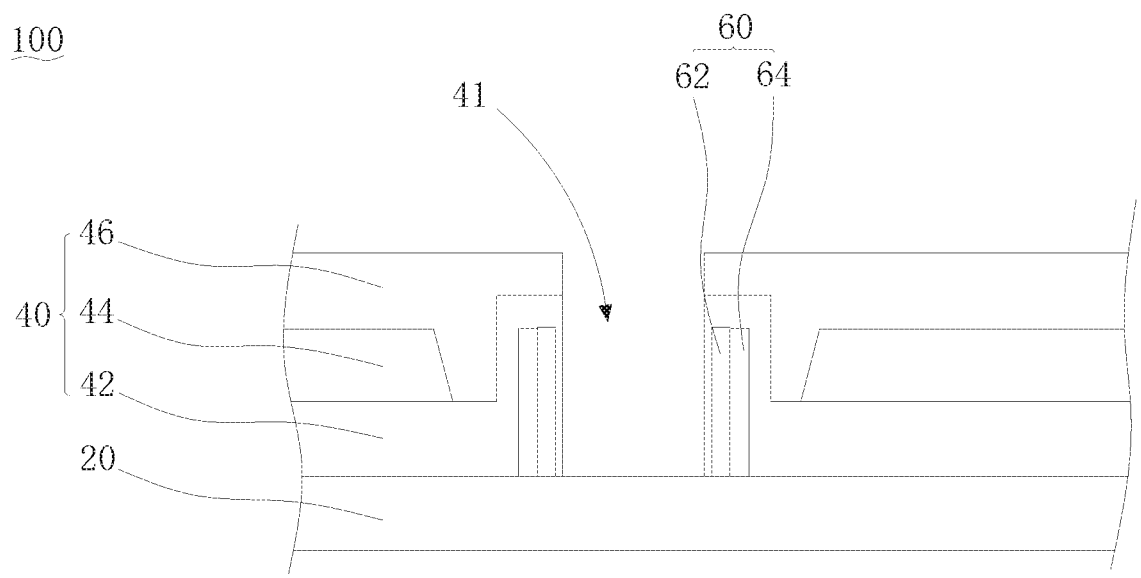
FIG. 3 is a cross-sectional view of a display panel in accordance with an embodiment.
Figure 4:
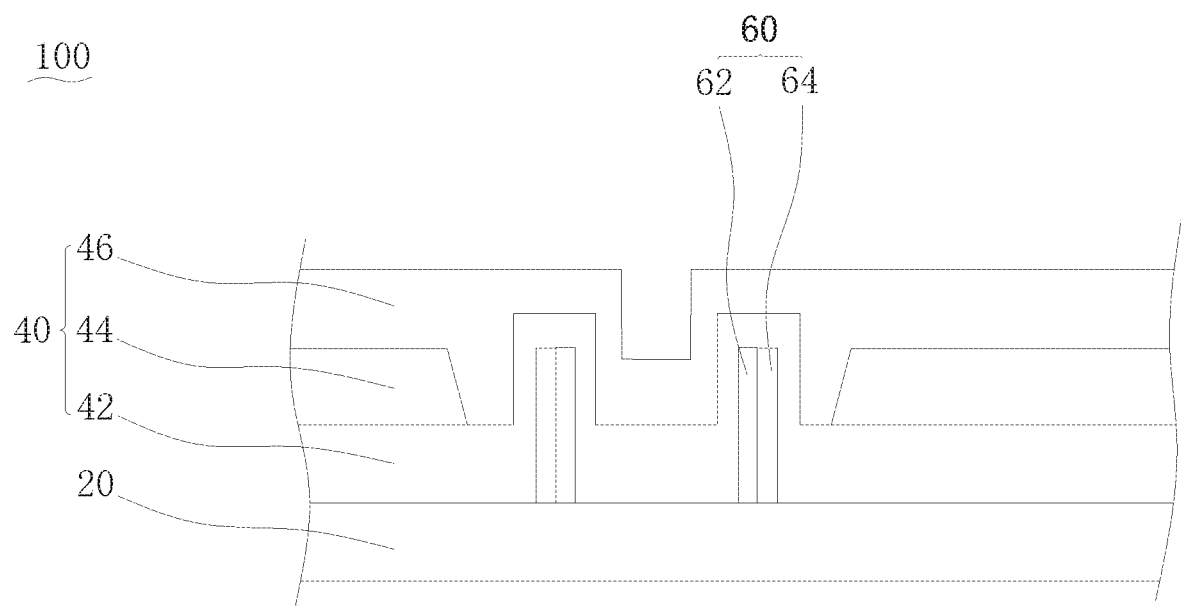
FIG. 4 is a cross-sectional view of a display panel prior to forming a mounting hole in accordance with an embodiment.

As shown in FIGS. 3 and 4, a display panel 100 is provided in the present embodiment, which is provided with a mounting hole 41, and includes a package structure 40 and a heat dissipation structure 60. The package structure 40 is disposed on a substrate 20 of the display panel 100. The heat dissipation structure 60 may be disposed inside the package structure 40 and close to the mounting hole 41. The mounting hole 41 may be formed in a display area of the display panel 100. The mounting hole 41 can be used to accommodate electronic components such as a photosensitive module, a camera, an earpiece, a start key, or a speaker.

In the afore-described display panel 100, since the heat dissipation structure 60 is located inside the package structure 40 and close to the mounting hole 41, thermal damage to the package structure 40 caused by the heat generated during the cutting of the mounting hole 41 can be avoided. Accordingly, the display panel 100 can form a mounting hole in the display area thereof to integrate an electronic component such as a camera without reserving a space outside the display area of the display panel 100 to accommodate the electronic component, thereby improving a screen occupation ratio of electronic apparatus provided with the display panel 100.

The display panel 100 may have the same or partially the same structure as the display panel 10 shown in FIGS. 1 and 2, which will not be described in detail herein.

As shown in FIG. 3 and FIG. 4, the package structure 40 includes at least two inorganic package layers stacked on each other and at least one organic package layer 44 disposed between the two inorganic package layers, so as to prevent water and oxygen from infiltrating while serve as a buffer. Specifically, the package structure 40 can be a thin film package structure including a first inorganic package layer 42, an organic package layer 44, and a second inorganic package layer 46 laminated with each other. The number of layers of the organic package layer and the inorganic package layer is not limited herein, and can be set as required.

Further, the heat dissipation structure 60 is disposed between the organic package layer 44 and the mounting hole 41, so that the heat generated during the process of the cutting to form the mounting hole 41 can be effectively blocked from being transferred to the organic package layer 44. In addition, since the organic package layer 44 does not extend to the mounting hole 41, water vapor, oxygen, and the like can be prevented from entering the package structure 40 from an inner side wall of the mounting hole 41 along the organic package layer 44, thereby improving a sealing effect of the package structure 40.

Specifically, in the present embodiment, the heat dissipation structure 60 is disposed around the mounting hole 41, so that the heat generated during the cutting process to form the mounting hole 41 can be prevented from being transferred from various angles in the circumferential direction of the mounting hole 41. Further, the heat dissipation structure 60 can have a hollow cylindrical structure, so that the mounting hole 41 having a circular cross section can be formed by cutting the display panel 100 along the inner side wall of the heat dissipation structure 60, so as to accommodate an electronic component having a circular cross section. In other embodiments, shapes of the heat dissipation structure 60 and the mounting hole 41 are not limited herein, and the heat dissipation structure 60 and the mounting hole 41 can be formed in a shape that matches electronic components of different shapes, thereby cooperating with electronic components of different shapes.

Furthermore, the display panel 100 further includes a substrate 20. The heat dissipation structure 60 can be directly formed on a surface of the substrate 20 close to the package structure 40 and in contact with the surface of the substrate 20 close to the package structure 40, thereby a portion of the heat generated during the cutting process to form the mounting hole 41 being directly transferred to the substrate 20, so that a portion of the heat can be dissipated through the substrate 20. Although the package cover plate is not shown in FIGS. 3 and 4, the display panel 100 can also include the package cover plate, and the heat dissipation structure 60 can be in direct contact with a surface of the substrate close to the package cover plate.

Specifically, the heat dissipation structure 60 includes a thermal conductive layer 62 disposed around the mounting hole 41. The thermal conductive layer 62 can be used to transfer heat. In addition, the heat dissipation structure 60 may further include a heat insulation layer 64 disposed around an outer side wall of the thermal conductive layer 62. Specifically, an inner side wall of the heat insulation layer 64 is in close contact with the outer side wall of the thermal conductive layer 62. The heat insulation layer 64 can be used to prevent heat transmission. The thermal conductive layer 62 located relatively close to the mounting hole 41 can transfer a portion of the heat generated during the process of the cutting to form the mounting hole 41 to the substrate 20 so as to quickly dissipate a portion of the heat, while the other portion of the heat can be dissipated through the air. In addition, residual heat without being dissipated by the thermal conductive layer 62 can be blocked by the heat insulation layer 64 surrounding the outer side wall of the thermal conductive layer 62, to prevent the residual heat from being dissipated to the package structure 40 on an outer side of the heat insulation layer 64 and causing heat damage to the package structure 40.

Further, a height of the heat insulation layer 64 with respect to the surface of the substrate 20 close to the package structure 40 is greater than or equal to a height of the thermal conductive layer 62 with respect to the surface of the substrate 20 close to the package structure 40, thereby ensuring a good heat insulation effect. In this embodiment, the height of the heat insulation layer 64 with respect to the surface of the substrate 20 close to the package structure 40 is slightly greater than the height of the thermal conductive layer 62 with respect to the surface of the substrate 20 close to the package structure 40, thereby ensuring the good heat insulation effect and avoiding an excessive thickness of the package structure 40.

In particular, the thermal conductive layer 62 can be made of one or more of thermal conductive silicon film, thermal conductive insulating material, thermal conductive interface material, thermal conductive silicone tape, thermal conductive tape, thermal conductive silicone grease, thermal conductive paste, heat dissipation paste, heat dissipation silicone grease, heat dissipation oil, heat dissipation film, thermal conductive film, and the like. The heat insulation layer 64 can be made of one or more of a porous material, a heat reflective material, a vacuum insulation material, and the like. Due to a low thermal conductivity of air or inert gas, the porous material can achieve heat insulation via pores of the material itself. The porous material can be, in particular, a material such as a foam material or a fibrous material. The heat reflective material may include one or more of gold, silver, nickel, aluminum foil, or metallized polyester, polyimide film, and the like, which have a high reflection coefficient so as to reflect the heat out. The vacuum insulation material can be a material such as an aerogel felt and the like, which utilizes internal vacuum thereof to block convection and achieve the heat insulation effect. The materials for forming the thermal conductive layer 62 and the heat insulation layer 64 are not limited herein, which can be provided according to different requirements.

In the afore-described display panel 100, the heat dissipation structure 60 can transfer the heat generated during the process of the cutting to form the mounting hole 41 to the substrate 20 and prevent the heat from being transferred to the package structure 40, thereby avoiding heat damage to the package structure 40. Accordingly, the display panel 100 can form a mounting hole in the display area thereof to integrate an electronic component such as a camera without reserving a space outside the display area of the display panel 100 to accommodate the electronic component, which is advantageous to improve the screen occupation ratio of the terminal device provided with the display panel 100. In addition, the heat dissipation structure 60 is disposed between the organic package layer 44 and the mounting hole 41 to prevent the organic package layer 44 from being exposed to the inner side wall of the mounting hole 41 and being in contact with water and oxygen, thereby improving the operation stability of the display panel 100 and prolonging the lifetime of the display panel 100.

Figure 5:
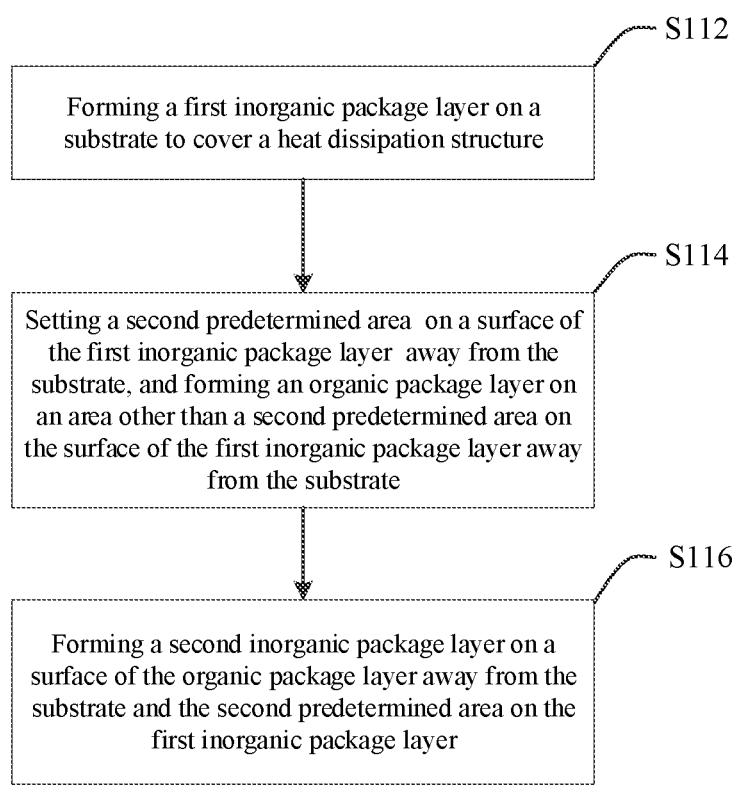
FIG. 5 is a flow chart of a manufacturing method of a display panel in accordance with an embodiment.

As shown in FIGS. 4 and 5, a method for manufacturing the display panel 100 according to the present embodiment includes the following steps.

In S110, a substrate 20 is provided, a first predetermined area is defined on the substrate 20, a heat dissipation structure 60 is provided in the first predetermined area, and a package structure 40 is formed outside the heat dissipation structure 60.

Specifically, the first predetermined area is located in a region of the substrate 20. The heat dissipation structure 60 can be a hollow annular structure. The heat dissipation structure 60 may include an annular thermal conductive layer 62 and a heat insulation layer 64 surrounding an outer side wall of the thermal conductive layer 62. The thermal conductive layer 62 is used to transfer heat, and the heat insulation layer 64 is used to prevent heat transmission.

Further, forming the package structure 40 may include the following steps.

In S112, a first inorganic package layer 42 is formed on the substrate 20 to cover the heat dissipation structure 60.

Specifically, the first inorganic package layer 42 can be made of one or more of silicon oxide, silicon nitride, aluminum oxide, titanium dioxide, graphene, etc., so as to have a good water and oxygen resistant property to prevent the substrate 20 and the heat dissipation structure 60 from being eroded by water and oxygen. In one embodiment, the first inorganic package layer 42 can be formed by an atomic layer or chemical vapor deposition.

The first inorganic package layer 42 is not necessarily required to cover the entire substrate 20, and in some embodiments, the first inorganic package layer 42 may cover only a portion of the substrate 20 on the premise of ensuring that the heat dissipation structure 60 is covered.

In S114, a second predetermined area is defined on a surface of the first inorganic package layer 42 away from the substrate 20. An organic package layer 44 is formed on an area other than the second predetermined area on the surface of the first inorganic package layer 42 away from the substrate 20. A range of an orthographic projection of the second predetermined area on the substrate 20 includes a range of an orthographic projection of the first predetermined area on the substrate 20.

Specifically, the organic package layer 44 may be made of one or more of acrylic resin, polyterephthalic acid plastic, pressure sensitive adhesive, polyethylene naphthalate, parylene, etc., so as to have a certain buffering effect to prevent the substrate 20 from being damaged by an external impact. In one embodiment, the organic package layer 44 can be formed via ink jet printing. Since the organic package layer 44 does not extend into the first predetermined area, the organic package layer 44 can be prevented from being damaged during a cutting process, so as to prevent water, oxygen or the like from entering the package structure 40 along the organic package layer 44, thereby improving a sealing effect of the package structure 40.

In S116, a second inorganic package layer 46 is formed on a surface of the organic package layer 44 away from the substrate 20 and on the second predetermined area on the first inorganic package layer 42.

Specifically, the second inorganic package layer 46 can be made of one or more of silicon oxide, silicon nitride, aluminum oxide, titanium dioxide, graphene, etc., so as to have a good water-oxygen resistant property to prevent the organic package layer 44 from being eroded by water, oxygen or the like. In one embodiment, the second inorganic package layer 46 can be formed by an atomic layer or chemical vapor deposition.

Further, the method for manufacturing the display panel 100 can further include the following steps: defining a third predetermined area on a surface of the second inorganic package layer 46 away from the substrate 20, forming a mounting hole 41 in the third predetermined area. The third predetermined area is smaller than the first predetermined area, and a range of an orthographic projection of the third predetermined area on the substrate is within the range of the orthographic projection of the first predetermined area on the substrate. The mounting hole 41 may penetrate the second inorganic package layer 46 and the first inorganic package layer 42. The mounting hole 41 may penetrate or may extend without penetrating the substrate 20.

The package structure 40 of the display panel manufactured by the afore-described manufacturing method of the display panel is formed by laminating the first inorganic package layer 42, the organic package layer 44, and the second inorganic package layer 46, which can prevent water and oxygen from seeping into the substrate 20 to affect the stability of the substrate 20, and at the same time, provide a buffer and protection effect for the substrate 20. In addition, since the organic package layer 44 is located outside the second predetermined area, that is, a heat dissipation structure 60 is provided between the organic package layer 44 and the mounting hole 41, the forming of the mounting hole 41 will not cause the organic package layer 44 to be exposed to the air, so that water and oxygen will not seep into the package structure 40 along the organic package layer 44.

The present disclosure further provides a display device including the display panel in any of the forgoing embodiments.

In the afore-described display panel and display device, the protective pattern layer blocks at least a portion of the energy of the laser beam during the movement of the laser beam from the package area B toward the mounting hole, so that the organic light emitting component and other components (e.g., a thin film transistor) in the display area are not irradiated with high intensity laser, thereby preventing the components in the display area from generating static electricity or being damaged. Thus, the laser device is not required to be paused in the package process of the display panel, the one-time package is realized, and the package process is simplified. At the same time, the laser energy is fully utilized to ensure the accuracy of the package process. Further, since the heat dissipation structure is located within the package structure and close to the mounting hole, the heat damage to the package structure by the heat generated during the process of the cutting to form the mounting hole can be avoided. Accordingly, the display panel can form a mounting hole in the display area thereof to integrate the electronic component such as a camera without reserving a space outside the display area of the display panel to accommodate the electronic component, thereby improving the screen occupation ratio of the electronic apparatus provided with the display panel.

Technical features of the foregoing embodiments can be randomly combined. For the brevity of description, not all possible combinations of the technical features in the foregoing embodiments are described. However, as long as combinations of these technical features do not contradict each other, it should be considered that the combinations all fall within the scope of this specification.

The foregoing embodiments only describe several implementations of this disclosure, which are described specifically and in detail, and are not intended to be construed as a limitation to the scope of the present disclosure. It should be noted that, persons of ordinary skill in the art can make various changes and improvements without departing from the ideas of this disclosure, which shall all fall within the protection scope of this disclosure. Therefore, the protection scope of this disclosure should be subject to the appended claims.

The invention claimed is:

1. A display panel comprising:
   a display area;
   a package area surrounding the display area;
   a substrate;
   a package cover plate bonded to the substrate in the package area via a package material melted by laser irradiation, the display area being provided with at least one mounting hole having a hole wall; and a protective pattern layer disposed between at least a portion of a boundary of the package area and the mounting hole for blocking at least a portion of a laser beam during a movement of the laser beam from the package area to the mounting hole.

2. The display panel according to claim 1, wherein the protective pattern layer comprises at least a reflective layer, and the reflective layer reflects at least a portion of the laser beam.

3. The display panel according to claim 2, wherein a material of the reflective layer comprises one or more of molybdenum, aluminum, and silver.

4. The display panel according to claim 1, wherein the protective pattern layer comprises at least an absorbing layer, and the absorbing layer absorbs at least a portion of the laser beam.

5. The display panel according to claim 4, wherein a material of the absorbing layer comprises indium tin oxide.

6. The display panel according to claim 1, wherein when the laser beam is incident from a side where the package cover plate is located, and the protective pattern layer being disposed on a surface of the package cover plate away from the substrate.

7. The display panel according to claim 1, wherein when the laser beam is incident from a side where the substrate is located, and the protective pattern layer is disposed on a surface of the substrate away from the package cover plate.

8. The display panel according to claim 1, wherein a boundary of an orthographic projection of the protective pattern layer on the substrate surrounds a region of an orthographic projection of a path of the movement of the laser beam on the substrate from the boundary of the package area to the mounting hole.

9. The display panel according to claim 1, further comprising:
   a package structure disposed on the substrate; and
   a heat dissipation structure positioned close to the mounting hole and disposed inside the package structure.

10. The display panel according to claim 9, wherein the heat dissipation structure is disposed around the mounting hole.

11. The display panel according to claim 9, wherein the heat dissipation structure is in contact with a surface of the substrate close to the package structure.

12. The display panel according to claim 9, wherein the heat dissipation structure comprises a thermal conductive layer disposed around the mounting hole.

13. The display panel according to claim 12, wherein the heat dissipation structure further comprises:
   a heat insulation layer disposed around an outer side wall of the thermal conductive layer.

14. The display panel according to claim 13, wherein a height of the heat insulation layer with respect to a surface of the substrate close to the package structure is greater than or equal to a height of the thermal conductive layer with respect to a surface of the substrate close to the package structure.

15. The display panel according to claim 10, wherein the package structure comprises:
   at least two inorganic package layers arranged in a stack; and
   at least one organic package layer disposed between the inorganic package layers.

16. The display panel according to claim 15, wherein the heat dissipation structure is disposed between the organic package layer and the mounting hole.

17. The display panel according to claim 15, wherein a material of the inorganic package layer comprises one or more of silicon oxide, silicon nitride, aluminum oxide, titanium oxide, and graphene.

18. The display panel according to claim 15, wherein a material of the organic package layer comprises one or more of acrylic resin, polyterephthalic acid plastic, pressure sensitive adhesive, polyethylene naphthalate, and parylene.

19. A display panel, wherein the display panel is a display panel with the protective pattern layer removed after a package of the display panel of claim 1 is completed.

20. A display device, comprising the display panel of claim 1.

* * * * *